United States Patent [19]

Gruzman et al.

[11] Patent Number: 4,639,572

[45] Date of Patent: Jan. 27, 1987

[54] LASER CUTTING OF COMPOSITE MATERIALS

[75] Inventors: Boris Gruzman, Binghamton; Carl-Otto Nilsen, Vestal, both of N.Y.

[73] Assignee: IBM Corporation, Armonk, N.Y.

[21] Appl. No.: 801,606

[22] Filed: Nov. 25, 1985

[51] Int. Cl.⁴ .............................................. B23K 26/00
[52] U.S. Cl. ........................ 219/121 LG; 219/121 LN; 219/121 FS; 219/121 LY
[58] Field of Search ............... 219/121 LG, 121 LN, 219/121 FS, 121 LC, 121 LD, 121 LH, 121 LJ, 121 LY, 121 LW, 121 L, 121 LM

[56] References Cited

U.S. PATENT DOCUMENTS

| | | | |
|---|---|---|---|
| 3,597,578 | 8/1971 | Sullivan et al. | 219/121 L |
| 3,604,890 | 9/1971 | Mullaney et al. | 219/121 L |
| 3,679,863 | 7/1972 | Houldcroft et al. | 219/121 LM |
| 3,989,778 | 11/1976 | Osborne | 219/121 LT X |
| 4,002,877 | 1/1977 | Banas | 219/121 LM |
| 4,324,972 | 4/1982 | Furrer et al. | 219/121 FS |
| 4,417,125 | 11/1983 | Tsutsumi | 219/121 FS X |

FOREIGN PATENT DOCUMENTS 0033079 8/1984 Japan .............. 219/121 LN

Primary Examiner—C. L. Albritton
Attorney, Agent, or Firm—Perman & Green

[57] ABSTRACT

A method and apparatus for laser cutting sheet material and especially for laser cutting composite sheet material. An inert gas shield, preferably of nitrogen, is provided at the cutting zone to minimize charred edges of the cut material and resulting in an extremely accurate and uniform cut line. The gas shield can also be used to accurately position the sheet material so as to lie at the focal point of the laser beam. Alternatively, a vacuum can draw the sheet material against a supporting surface for positioning the sheet material. In a continuous process, one or more stationary lasers operating on an advancing web of the sheet material are positioned to cut in the longitudinal direction and a movable laser is positioned to cut in the transverse direction. Mechanical expedients enable the movable laser to make a cut perpendicular to the cut made by each stationary laser without interrupting the flow of the sheet material.

19 Claims, 12 Drawing Figures

LASER CUTTING OF COMPOSITE MATERIALS

BACKGROUND OF THE INVENTION

1. Field of the Invention

The present invention relates to a method and apparatus for laser cutting sheet material and especially for laser cutting composite sheet material. An inert gas shield is provided on both sides of the sheet material at the location of the cut to prevent oxidation thereof. Additionally, the sheet material is accurately positioned so as to lie at the focal point of the laser beam when the cut is performed.

2. Description of the Prior Art

It has become customary to form on dielectric sheet material printed circuits used in a variety of electronic components. One type of material which has come to be widely used are composites such as glass fiber cloth as a matrix embedded in or impregnated with an epoxy resin. In its uncured state, such composite materials are often times referred to as "prepreg". Prepreg is flexible and in sheet form is capable of being wound onto a roll.

In present day practice, the prepreg may typically be cut into rectangular slabs, or other appropriate shapes, then cured into hardened boards with copper sheets applied as exterior surfaces thereof, after which the printed circuitry is configured on the outer surface thereof. However, there are a number of problems inherent in the mechanical cutting process which has been used heretofore. Even with fresh cutting blades, frayed or jagged edges of the cloth matrix and tearing of the resin layer customarily result and such results are compounded with increased age, and therefore dullness, of the blades. Large amounts of dust also result from the mechanical cutting process and are deposited on the surfaces of the individual boards. Migration of this dust to the top surface of the copper sheets during subsequent lamination processes requires its removal before the subsequent etching process resulting in formation of the electrical circuit thereon. This causes another step to be added to the circuit board making process with resultant increase in cost. Additionally, the cutting blades must be frequently sharpened or replaced and the cutting mechanism generally requires a substantial degree of maintenance especially for the moving components. Another drawback of the mechanical cutting operation is the limited flexibility of such a system for cutting prepreg boards of various sizes.

Because of these drawbacks of mechanical cutting systems, the cutting of prepreg with a laser has been considered as a viable alternative. Lasers have been used for some time to cut a variety of materials including metals, wood, fabric and paper. However, to date, there has been no widespread usage of lasers for cutting composite materials. Typical of the prior art are the U.S. Pat. No. 3,597,578 issued Aug. 3, 1971 to Sullivan et al and 3,604,890 issued Sept. 14, 1971 to Mullaney et al. Both of these disclose the cutting of various materials by means of concentrated laser beams. Improvements on such basic patents are disclosed, for example, in U.S. Pat. No. 3,679,863 issued July 25, 1972 to Houldcroft et al. According to this patent, a jet of gas such as air, argon, or nitrogen carrying an atomized stream of a liquid coolant such as water is directed onto the moving region of the workpiece at which the laser beam is concentrated. As recited in the patent, this reduces the spread of charring or tar deposit from the cut along the upper and lower surfaces of the cut portions and also reduces the smoke and smell to negligible proportions. A further improvement is provided in U.S. Pat. No. 4,002,877 issued Jan. 11, 1977 to Banas. According to this disclosure, a stream of liquid coolant such as water is directed onto the material vaporization region to absorb energy from the outer region of the cut area, said to prevent adhesion of adjacent layers, globularization, singeing, or permitting other undesired effects.

However, composite materials add even further problems because they employ at least two types of materials having different characteristics. For example, the prepreg material already discussed comprises a matrix of glass in fiber form supported in a layer of uncured epoxy resin. Since each of these materials oxidizes at a different temperature, use of lasers which have been adequate to cut other materials has been inadequate for cutting the prepreg material. This is for the reason that the temperatures necessary to cut the glass fibers would cause the epoxy resin to decompose and melt resulting in undesirable flow of the fibers within the resin and charring and tearing of the resin layer.

SUMMARY OF THE INVENTION

It was, therefore, knowledge of the prior art and of the problems existing which gave rise to the present invention. In brief, the present invention, is directed towards a method and apparatus for laser cutting sheet material and especially for laser cutting composite sheet material. An inert gas shield, preferably of nitrogen, is provided at the cutting zone to minimize charred edges of the cut material. The same gas shield can also be used to accurately position the sheet material so as to lie at the focus or focal plane of the laser beam. Alternatively, a vacuum can draw the sheet material against a supporting surface for positioning the sheet material. In a continuous process, operating on an advancing web of the sheet material, one or more stationary lasers are positioned to cut in a longitudinal direction and a movable laser is positioned to cut in a transverse direction. Mechanical expedients enable the movable laser to make a cut perpendicular to the cut made by each stationary laser without interrupting the advance of the sheet material.

The inert gas shield operates on both sides of the sheet material in order to be fully effective. Specifically, an atmosphere of inert gas is introduced to the surface of the sheet material distant from the laser and proximate to the anticipated cut line made by the laser beam. Simultaneously, a cylindrical jet of inert gas is directed against the surface of the sheet material at which the laser beam is directed, the jet of inert gas being coaxial with the laser beam. The combination of the atmosphere of inert gas on one side of the sheet material and of the cylindrical jet of inert gas directed at the other side operate together to define the gas shield which enables successful laser cutting of composite materials.

Accordingly, the present invention enables a continuous one operation automated process for cutting sheet material and, particularly, for cutting sheet material composed of different substances without charring the cut line or otherwise causing deformation thereto. Also, the invention enables increased feed rates for the sheet material to be cut as well as substantially reducing dust which is created by the cutting operation.

Other benefits include the fact that lasers provide a more accurate and more uniform cut through the sheet material and are readily adjustable to accommodate different sizes of the end product. Furthermore, a machine incorporating the invention results in reduced maintenance, one example being the elimination of the necessity to sharpen or replace cutting blades which are utilized in mechanical cutters.

Other and further features, objects, advantages and benefits of the invention will become apparent from the following description taken in conjunction with the following drawings. It is to be understood that both the foregoing description and the following detailed description are exemplary and explanatory but are not restrictive of the invention. The accompanying drawings, which are incorporated in and constitute a part of this invention, illustrate some of the embodiments of the invention and, together with the description, serve to explain the principles of the invention in general terms.

DESCRIPTION OF THE PREFERRED EMBODIMENTS

Figure 1:
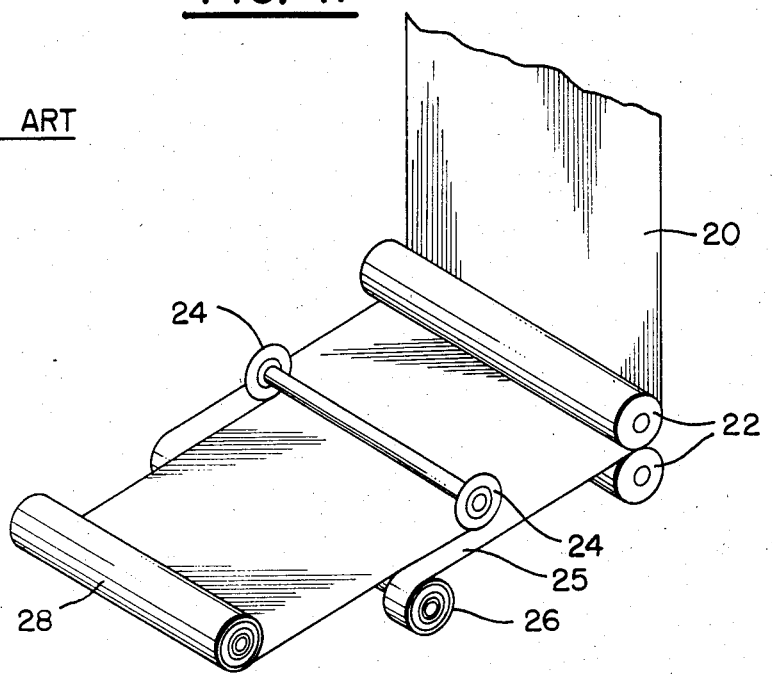
FIGS. 1 and 2 are perspective views illustrating successive operations performed by a mechanical cutting machine in a fashion typical of the prior art.

Heretofore, it has been customary to cut prepeg sheet material in a continuous operation into boards utilizing mechanical cutting methods. In a typical portrayal of the prior art, FIG. 1 depicts a continuing sheet of prepeg material 20 advancing between a pair of rolls 22. As the sheet 20 advances, it is operated on by a pair of rotary cutting blades 24 which serve to remove undesirable edge portions 25 of the sheet 20. These undesirable edge portions may then be rolled up as at 26 for subsequent disposal. The main portion of the sheet 20 is formed into a roll 28 in preparation for a subsequent operation.

Figure 2:
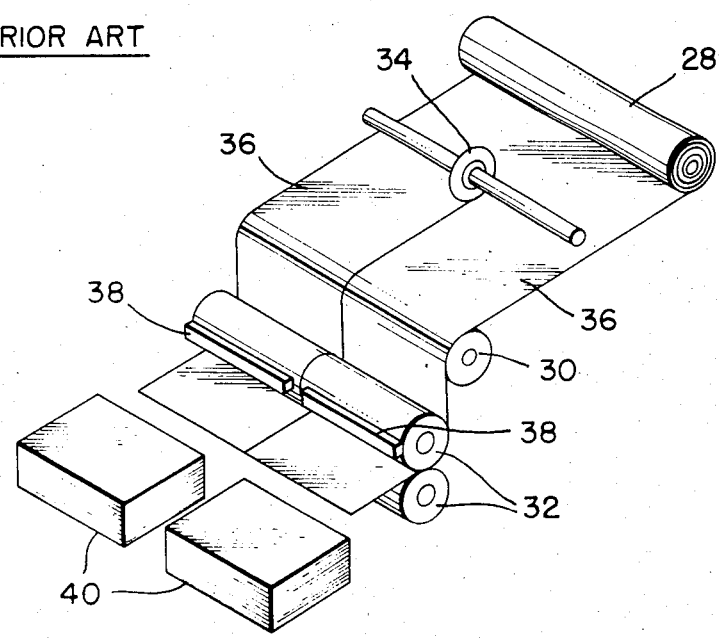

Such a subsequent operation is illustrated in FIG. 2 in which the roll 28 is then unrolled and, in a typical fashion, advanced over a roller 30 and between a pair of rollers 32. In the course of being so advanced, the sheet 20 is cut longitudinally by a rotary cutting blade 34. This balde serves to cut the sheet 20 into narrower strips or webs 36. Then, immediately adjacent the pinch rollers 32, horizontal cutting blades 38 positioned above each of the webs 36 are then operated to cut the prepreg material into finite sized sheets 40 which are illustrated in stacked form.

Figure 3:
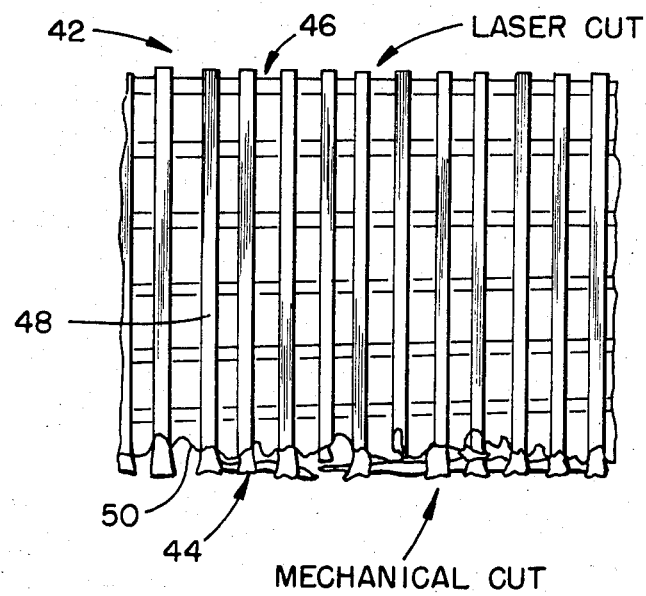
FIG. 3 is a detail top plan view illustrating a fragment of prepreg material which has been subjected to both a laser cut and a mechanical cut.

While such cutting methods have been successfully employed in the past, speed of the operation is limited, there is little flexibility for adjusting sizes of the end product, and the machinery requires substantial maintenance including relatively frequent replacement or sharpening of the cutting blades. An even more serious drawback of the use of mechanical cutting methods is presented in FIG. 3 which illustrates a fragment 42 of a sheet of prepreg material depicting one edge 44 which has been mechanically cut and an opposite or parallel edge 46 which has been cut by means of a laser utilizing the teachings of the present invention. The distress caused by the mechanical cut along the edge 44 is readily apparent. Ends of the transverse extending fiber strands 48 are jagged, uneven relative to one another, and broadened in a nonuniform fashion.

Additionally, the edge 50 of the epoxy layer has been torn or broken and removed in a nonuniform manner resulting in the exposure of substantial lengths of the fiber strands 48. The edge 46 formed by the laser cut contrasts with the edge 44 formed mechanically in every respect and is noticeably far superior thereto.

Figure 4:
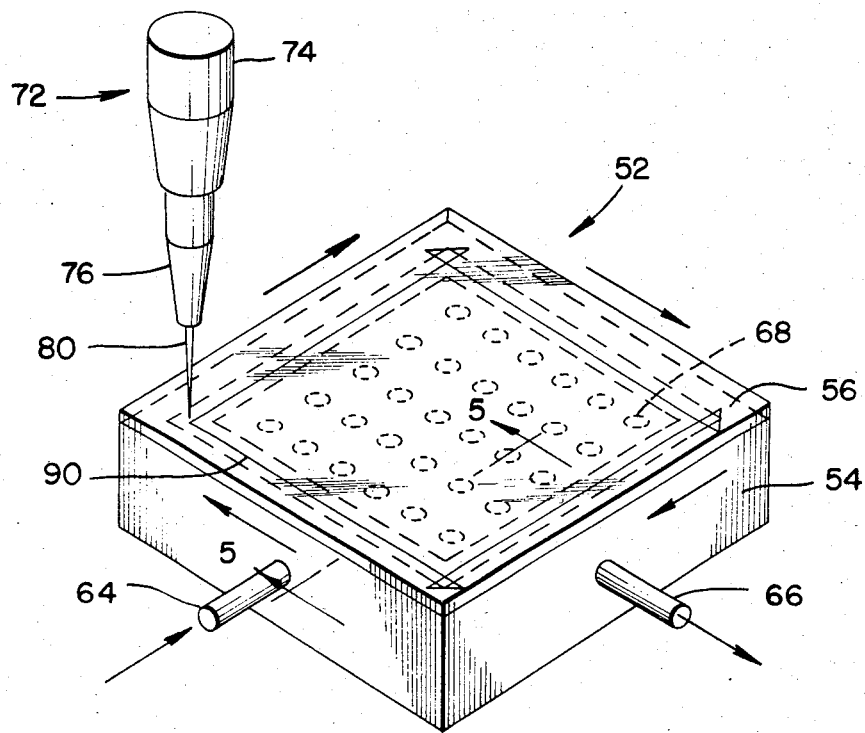
FIG. 4 is a perspective view illustrating a system embodying the invention.

Turn now to FIG. 4 which illustrates a laser cutting system 52 which embodies the principles of the present invention. The laser cutting system 52 includes a box structure 54 across which a sheet 56 of the prepreg material is suitably advanced. An upper surface 58 (see FIG. 5) of the box structure 54 is generally planar but is formed with a continuous channel 60 which extends around the upper surface 58 at locations slightly inboard from external side walls 62 of the box structure 54. Tubing 64 is suitably attached to the box structure 54 and communicates with the channel 60 at an end distant from a source (not shown) of pressurized inert gas, such as nitrogen. A suitable valve mechanism (not shown) can be utilized to selectively permit the inert gas to flow into the channel 60 when a sheet of prepreg material 56 overlies the box structure 54. In a similar fashion, tubing 66 is suitably connected to the box structure 54 and extends between the pressurized gas source (not shown) channel 60. The tubing 66 serves as an outlet to return the pressurized inert gas to its source after passing through the channel 60. In this fashion, a continuous flow of pressurized inert gas passes through the channel 60 when the sheet of prepreg material 56 is positioned over the upper surface 58 of the box structure 54.

Figure 5:
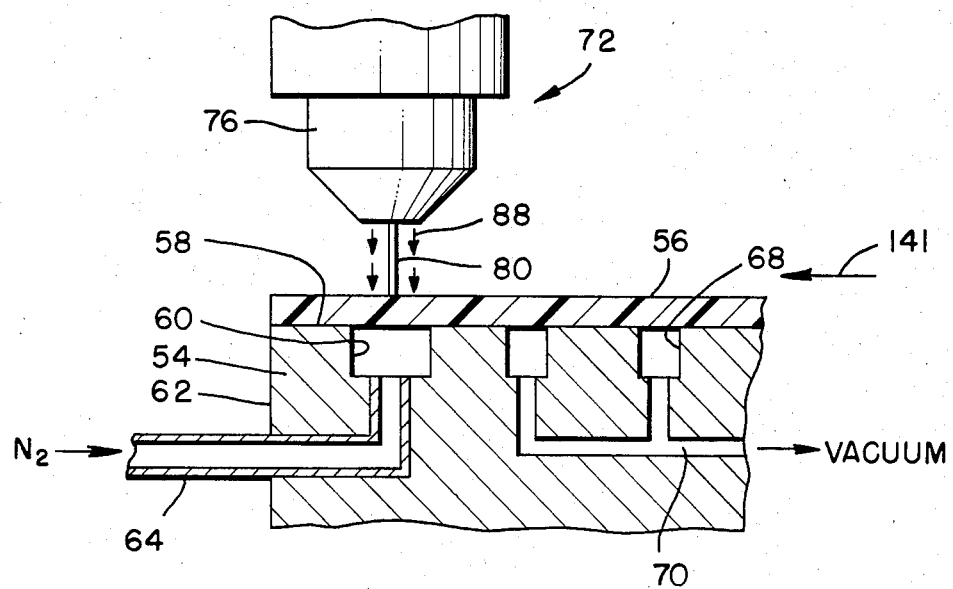
FIG. 5 is a detail cross section view taken generally along line 5—5 in FIG. 4.

In one embodiment of the invention, as seen in FIG. 5, a plurality of vacuum ports 68 are formed in the upper surface 58 of the box structure 54 and connect by way of a conduit 70 to a source of vacuum which may be, for example, 5-9 inches of mercury. As vacuum is applied to the ports 68, the advancing sheet 56 of prepreg material is drawn into engagement with the upper surface 58 of the box structure 54. This serves to lend stability to the sheet of prepreg material, but even more importantly, to accurately position and maintain the sheet material in the focus of the laser for the cutting operation which will be described below.

Figure 6:
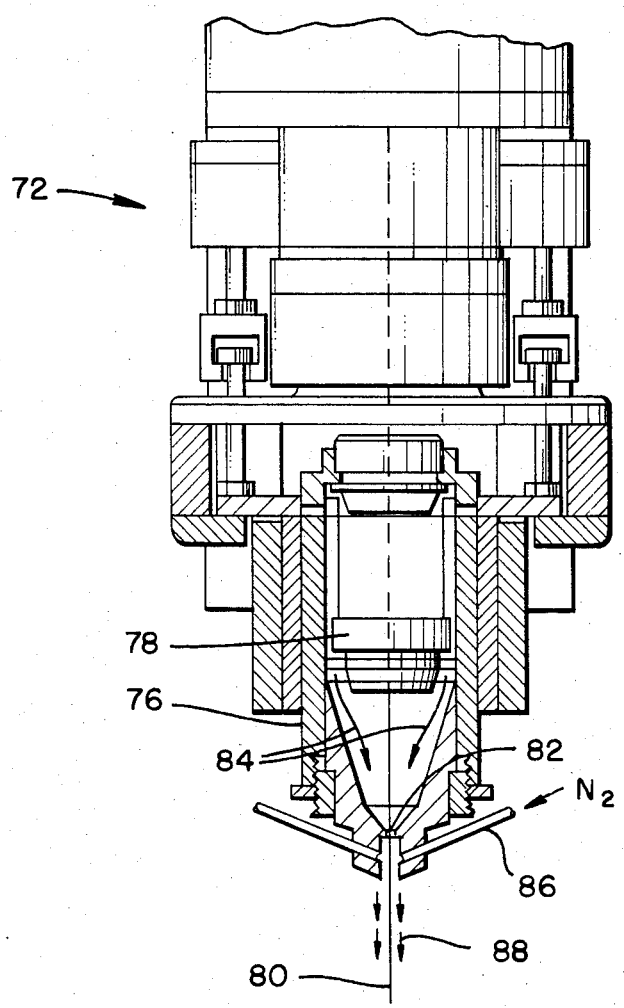
FIG. 6 is a side elevation view, certain parts being cut away and shown in section, of a laser nozzle which can be utilized with the invention.

A laser nozzle assembly 72 of the type which can be employed by the invention is partially illustrated in FIG. 6. One laser which is suitable for the purposes of the invention is a model 41 250 watt carbon dioxide unit manufactured by Coherent, Inc. of Palo Alto, Calif. A discharge tube which connects to a nozzle assembly 72, by way of example, can be supplied with a mixture of 4.5% $CO_2$, 12.3% $N_2$, 82% He with excitation by electrical discharge within the tube. Output is at a 10.6 micron wave length, and the unit employs an 8 mm beam diameter directed through an adjustable focusing lens 78 within a lens mount assembly 76 converging at the work surface, that is at the sheet 56 of prepreg material (see FIGS. 4 and 5). An acceptable lens for the system would have a 62.5 mm focal length with 0.06 mm spot size at $1/e^2$. The laser nozzle 72 thus serves to direct a beam 80 at the surface of the sheet 56 of prepreg material and of sufficient intensity to make a clean cut through the sheet.

Simultaneously, pressurized inert gas, a preferred example being nitrogen, is directed through the nozzle assembly 72, thereby cooling the focusing lens and then passing through an aperture 82 at an extremity of the lens mount assembly 76. Nitrogen is a preferred gas because of the excellent results obtained when it is used as well as its ready availability at relatively low cost. This flow is generally as indicated by arrows 84 in FIG. 6. An additional flow of inert gas is directed toward the beam 80 from a plurality of radially extending tubes 86 all converging close to the axis of the beam 80 near the aperture 82. The inert gas from each of these sources, by reason of the geometry illustrated in FIG. 6, is caused to surround the beam 80 in the manner of a cylinder 88 which is coaxial with the beam 80. This flow of the inert gas is represented by arrows 88 in FIGS. 5 and 6. As shown in FIG. 5, the inert gas surrounds or encompasses the beam 80 throughout its travel from the nozzle 76 until it strikes the surface of the sheet 56 of prepreg material.

At the same time that the area or zone of impact of the beam 80 on the surface of the prepreg material 56 is isolated from the surrounding atmosphere, the underside of the sheet 56 is similarly isolated along the cut region by reason of the inert gas flowing in the channel 60. Specifically, as best seen in FIG. 4, the laser nozzle 72 is moved relative to the box structure 54 so that the beam 80 follows the path of the channel 60. Thus, an entire cut line 90 (see FIG. 4) is kept isolated from the surrounding atmosphere as the cutting operation proceeds. In this manner, oxidation is prevented along the cut line and the flow of gas contributes to minimize the heat effected zone and thus the curing effects on edge of the material being cut. Specifically, the amount of polymer cross-linking that occurs in the epoxy structure of the prepreg alongside the cut line can thereby be minimized at this earlier stage of processing.

Figure 7:
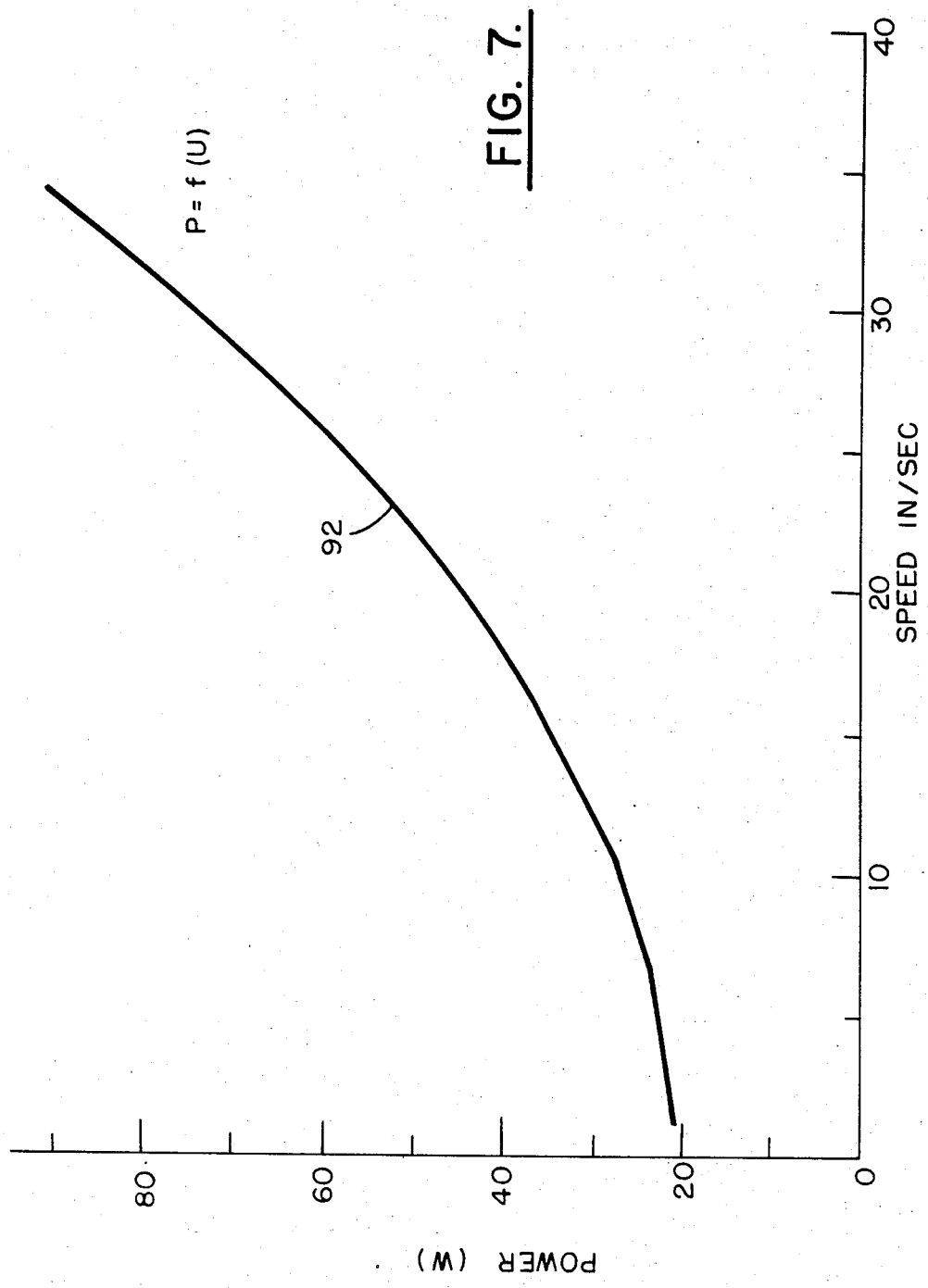
FIG. 7 is a graph illustrating the power versus speed requirements of a laser cutting device as imployed by the invention.

It has been found that the quality of the cut is directly related to speed and, generally, the highest possible speed will result in the best cut assuming the power remains constant. Additionally, at the highest possible speed, the heat effected zone is minimized. The correlation of power versus speed as illustrated by a curve 92 in FIG. 7 is an important consideration as well. If speed is too slow, or power too great, burning of the composite material will result. On the other hand if speed is too great or power too low, the composite material will not be cut. The composite material is difficult to cut because a significant amount of power is required to cut the glass fiber portion and only minimal power is required to cut the epoxy portion. Laser cutting therefore requires a compromise between power and speed such as represented by the curve 92. Although increased power is necessary in order to achieve higher cutting speeds as illustrated by the curve 92 in FIG. 7, such increase in power requirements is well within the range of available power to achieve the speeds desired. Gas flow is also a significant item. At lower pressures, on the order of 10 psi, both the heat effected zone is larger and the undesirable movement of the glass fiber strands within the layer of the epoxy resin is greater. Additional detriments include a concurrent increase in the amount of debris and the time for curing. At higher gas pressures, on the order of 20 to 30 psi, results are significantly better. At increased pressures, the width of the cut is reduced and curing and fiber movement are well within design parameters. The gas shield also cools down both materials thereby preventing melting of the epoxy while still enabling cutting of the glass.

Figure 8:
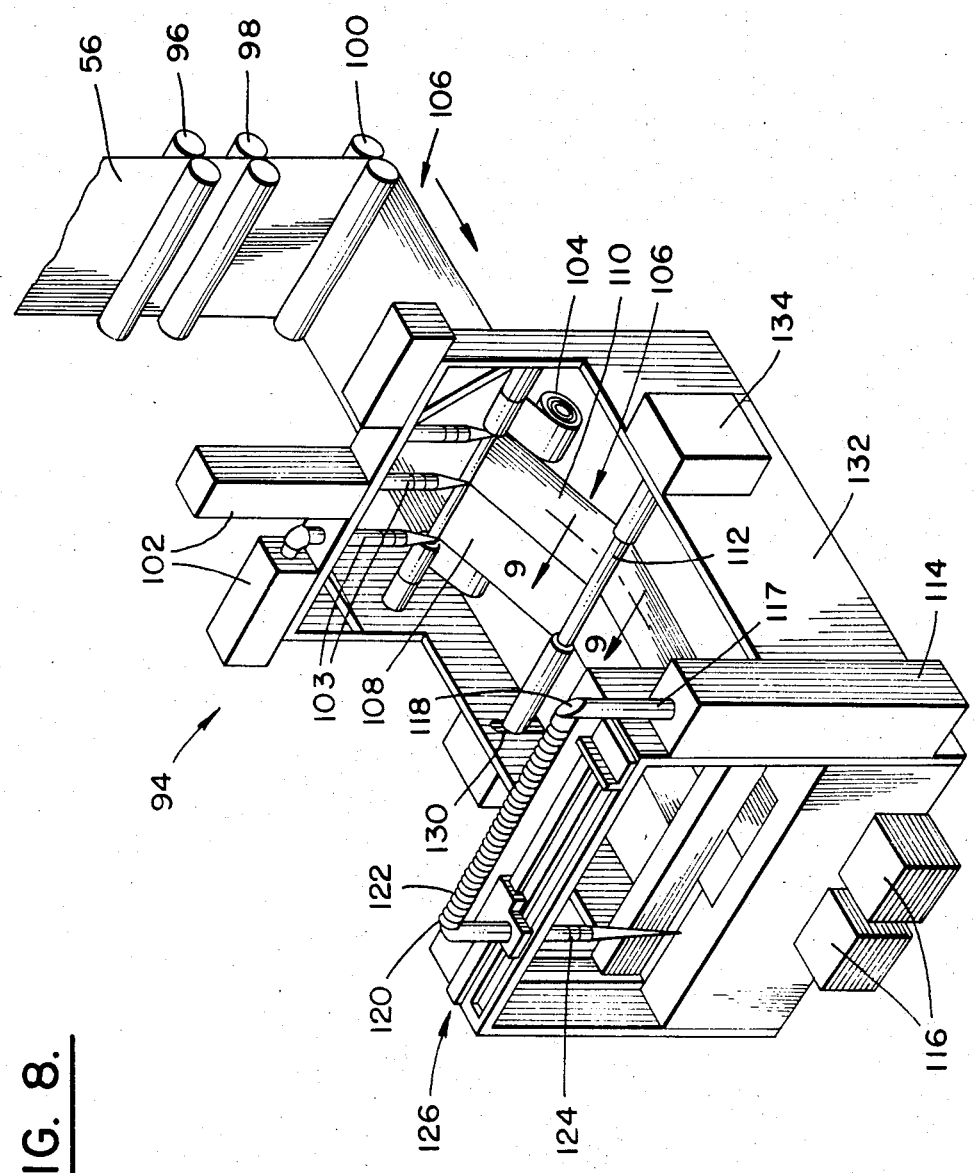
FIG. 8 is a perspective view of a continuous operation laser cutting machine embodying the invention.

Turning now to FIG. 8, a production style cutting machine 94 is depicted which incorporates the concepts discussed above and utilizes them in a high speed continuous operation. Thus, a sheet of prepreg material 56 is drawn between suitable pairs of rollers 96, 98, and 100, then directed toward a first work station at which a plurality of positionally fixed lasers 102 direct their beams onto the sheet material to cut the same. As illustrated, the two outermost lasers operate to remove edge material 104 from a main web 106 of the sheet material. The edge material 104 can be suitably wound for subsequent disposal. A centrally positioned laser is simultaneously operable to cut the main web 106 in the direction of its movement thereby resulting in a pair of narrowed webs 108 and 110. The narrowed webs 108 and 110 then pass beneath an accumulator roller 112 toward a work station at which a laser 114 operates to cut the narrowed webs 108 and 110 in the transverse direction to thereby form individual impregnated sheets 116.

The laser 114 includes a discharge tube 117 and a pair of transverse mirrors 118 and 120 which communicate through telescoping tubing 122 to direct the beam to a nozzle 124. A suitable operating mechanism 126 serves to move the nozzle 124 transversely of the narrowed webs 108 and 110 thereby cutting the end portions of the webs into the individual circuit boards 116. In order to assure that the cut across the webs 108 and 110 is in a direction perpendicular to their direction of advance, the accumulator roller 112 is operated in a manner to be described which results in momentarily interrupting further longitudinal advance of the webs 108 and 110 in the region of the laser nozzle 124.

Figure 9:
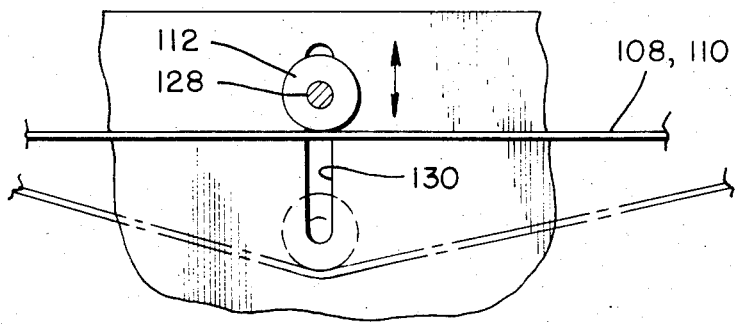
FIG. 9 is a detail cross section view taken generally along line 9—9 in FIG. 8.

As seen in FIG. 9, the accumulator roller 112 is rotatably mounted on a shaft 128. At its outermost ends, the shaft 128 extends through vertically disposed slots 130 formed in the sidewalls 132 of the cutting machine 94 (FIGS. 8 and 9). On signal or at timed intervals depending upon the speed of advance of the webs 108 and 110, suitable mechanisms 134 illustrated in FIG. 8 as being mounted on the sidewalls 132 are operable to move the shaft 128 in a vertical plane as defined by the slots 130. As seen in FIG. 9, as the roller 112 is moved downwardly it moves the webs 108 and 110 downwardly also thereby increasing the travel distance of the webs to the region of the laser nozzle 124. This has the effect of causing the narrowed webs 108 and 110 to momentarily cease movement in the region of the nozzle 124. It is during this lull in movement of the webs that the operating mechanism 126 is operated to move the nozzle 124 transversely of the webs 108 and 110. Thus occurs the transverse cutting operation thereby forming the individual impregnated sheets 116. It will be appreciated that for this purpose, the operation of the mechanisms 126 and 134 must be suitably accoordinated to assure that proper cuts will be made by the nozzle 124.

Figure 10:
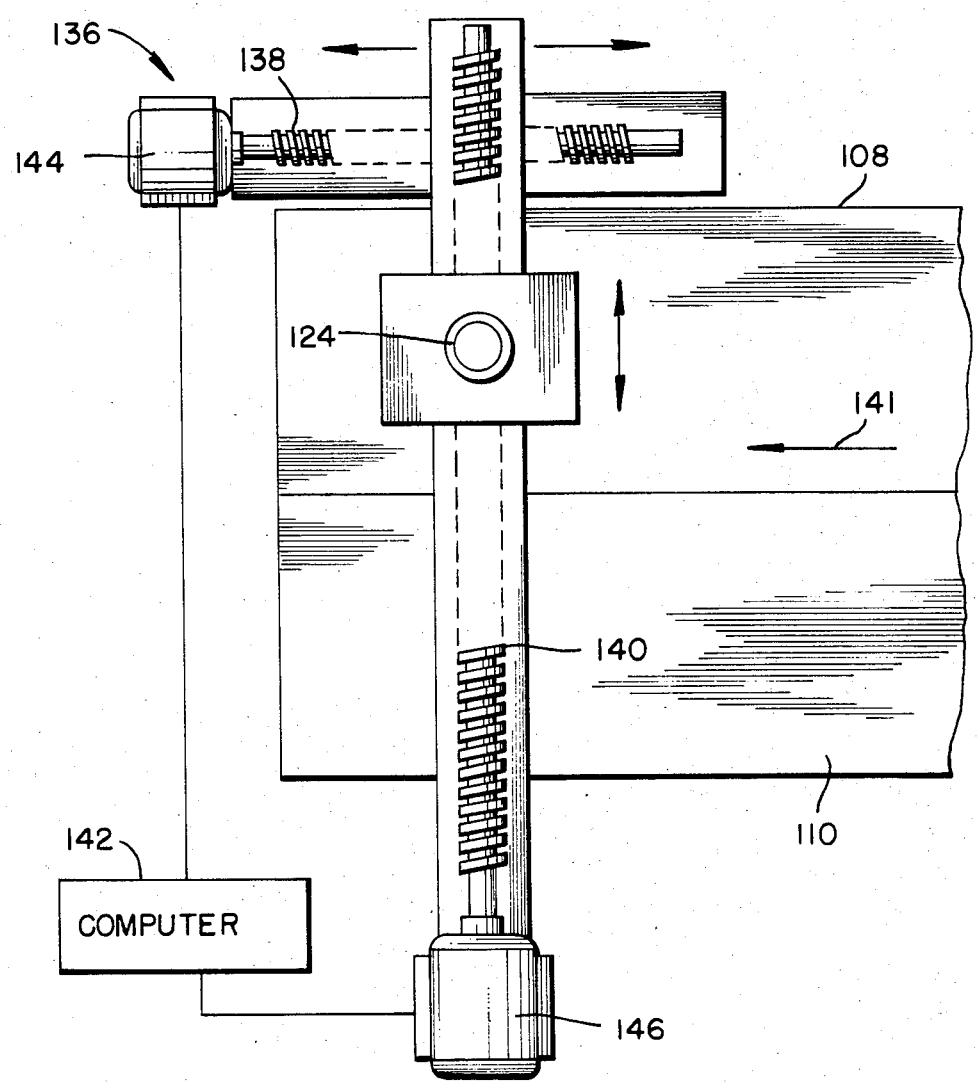
FIG. 10 is a detail top plan view of another embodiment of the invention.

In a different embodiment as partially and schematically depicted in FIG. 10, an operating mechanism 136 can be provided to replace the accumulator roller 112 and its associated mechanisms 134 as well as the transverse operating mechanism 126. The operating mechanism 136 is mounted on the structure of the cutting machine 94 generally in place of the transverse operating mechanism 126. It serves to operate the nozzle 124 in such a way as to perform transverse cuts of the webs 108 and 110 perpendicular to the direction of advance of the web even as the webs continue to move through the region of the nozzle 124. This is accomplished by using a pair of lead screws 138 and 140 positioned perpendicular to one another and together supporting the nozzle 124. The lead screw 138 has its axis parallel to the direction of movement of the webs 108 and 110 as represented by an arrow 141. The lead screw 140 has it axis perpendicular to the direction of movement of the webs 108 and 110. A computer 142 is informed of the speed of advance of the webs 108 and 110 and appropriately energizes a motor 144 to drive the lead screw 138 and a motor 146 to drive the lead screw 140. Controlled by the computer 142, the lead screws 138 and 140 operate to move the nozzle 124 to assure a cut perpendicular to the direction of the advancing webs 108 and 110 and thereby form the sheets 116.

Figure 11:
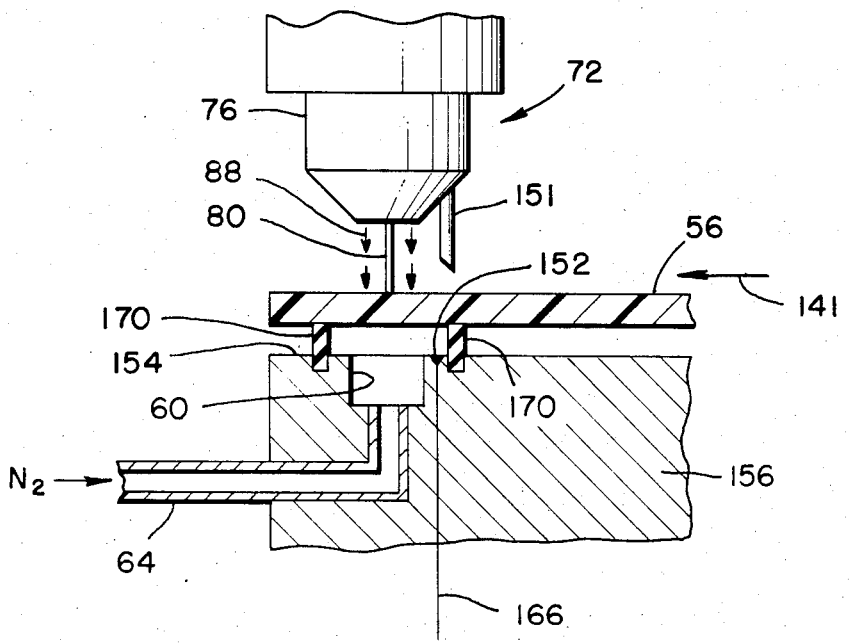
FIG. 11 is a cross section view, similar to FIG. 5, illustrating still another embodiment of the invention.
Figure 12:
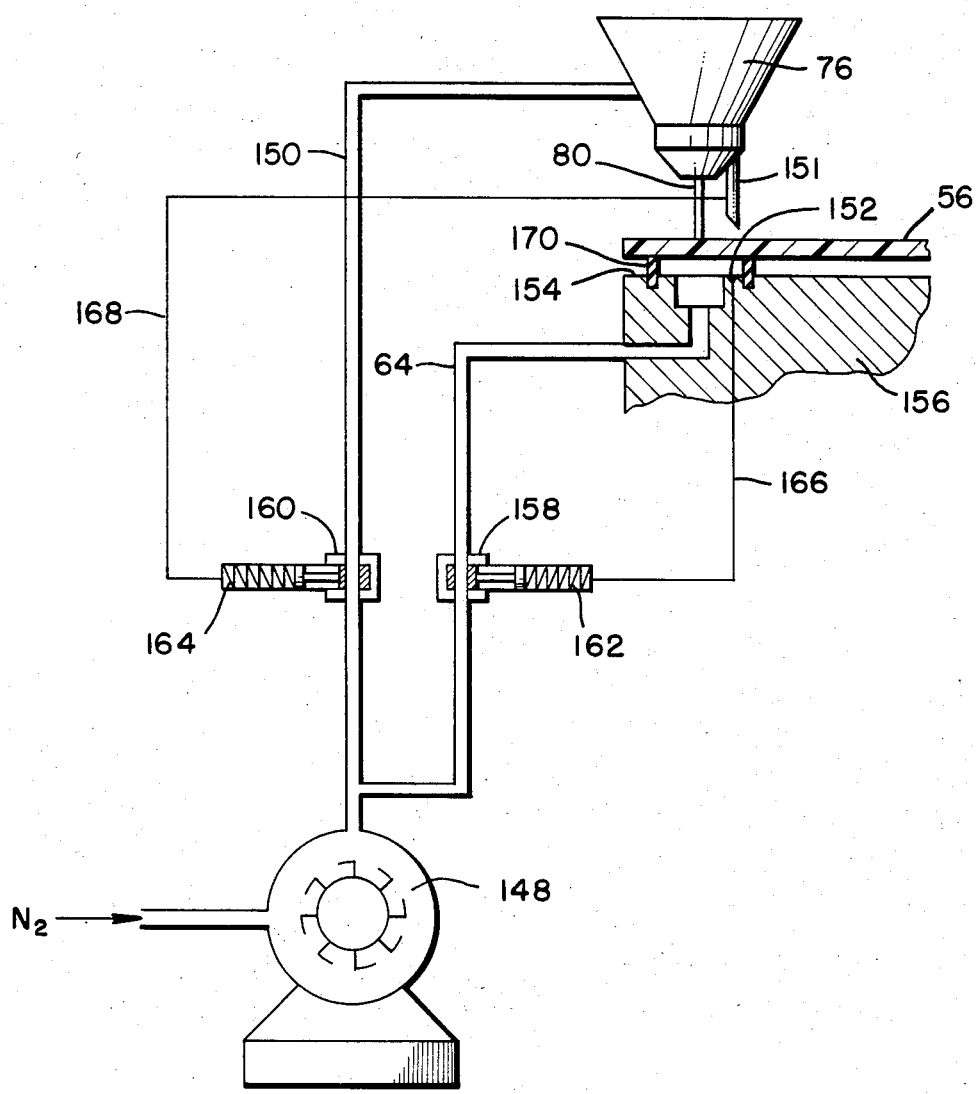
FIG. 12 is a schematic representation of a system utilized with the embodiment of FIG. 11.

Turn now to FIGS. 11 and 12 which depict yet another embodiment of the invention. The embodiment of FIGS. 11 and 12 is considered to be an improvement over that of FIG. 5 which operated to maintain the sheet 56 of prepreg material in the focus of the laser nozzle 72. It will be appreciated that the vacuum drawing the sheet 56 of prepreg material against the upper surface 58, while properly performing its role of maintaining the proper positioning of the prepreg material unfortunately increases the friction of the prepreg material as it is drawn across the upper surface 58. This undesirably slows the movement of the prepreg material and thereby limits the entire rate of throughput of the system. A primary purpose of the embodiment of FIGS. 11 and 12 is to avoid the frictional losses to which the sheet of prepreg matrial 56 is subject in the FIG. 5 embodiment.

Thus, as seen in FIGS. 11 and 12, an inert gas such as nitrogen is drawn by a pump 148 from a source (not shown) and directed via tubing 64 and 150 to the channel 60 and nozzle assembly 72, respectively. A locator 151 of any suitable type including a sensing mechanism and a detecting mechanism is schematically illustrated as being attached to the nozzle assembly 72, and determines the distance of the sheet 56 of prepreg material from the nozzle assembly. In the same manner, a locator 152 similar to locator 151 serves to determine the distance of the sheet of prepreg material 56 away from an upper surface 154 of a box structure 156 which is similar to the box structure 54 but lacking the vacuum ports 68 and conduit 70 as illustrated in FIG. 5. Of course, the box structure 54 could be used for purposes of the presently described embodiment so long as the ports 68 and conduit 70 were not subjected to vacuum.

As illustrated in FIG. 12, the flow of inert gas through the tubes 64 and 150 is regulated by valves 158 and 160, respectively. They may be pinch valves, for example, each regulated by a suitable control mechanism, 162 and 164, respectively. In turn, each control mechanism is in communication via lines 166 and 168, respectively, with its associated locator, 151 and 152 respectively. Thus, if the locator 151 determines that the sheet 56 of prepreg material is too close to the nozzle 76, it sends a signal to the control mechanism 164 to move the valve 160 to increase the flow of inert gas through the tube 150 to thereby increase the force of the gas acting on the upper surface of the sheet of prepreg material. The operation of the locator 152 and its associated valve 158 and control mechanism 162 operates in a similar fashion. It might also be desirable to operatively tie the control mechanisms 162 and 164 together so that the entire operation is coordinated. Since the sheet of prepreg material 56 is positioned distant from the upper surface 154 as it advances across the box structure 156, it would be desirable from an economy stand point and also for efficiency of operation that upstanding seals 170 be provided to hold the gas captured in a region of the channel 60. It will thus be seen that the sheet of prepreg material 56 can be moved rapidly across the box structure 156 while being accurately maintained in the focus of the nozzle assembly 72.

While preferred embodiments of the invention have been disclosed in detail, it should be understood by those skilled in the art that various modifications may be made to the illustrated embodiments without departing from the scope as described in the specification and defined in the appended claims.

We claim:

1. A method of laser cutting of sheet material while minimizing oxidation thereof comprising the steps of:
   directing a laser beam at a first surface of the sheet material;
   selectively moving the beam and the sheet material relative to one another to thereby cut the sheet material;
   isolating in an atmosphere of inert gas a second surface of the sheet material opposite the first surface and proximate to the anticipated cut line to be made by the laser beam; and
   simultaneously directing a cylindrical jet of inert gas against the first surface of the sheet material at which the laser beam is directed, the jet of inert gas being coaxial with the laser beam to thereby isolate a region of the first surface surrounding the location at which the laser beam strikes the first surface.

2. A method as set forth in claim 1 including the step of:
   accurately positioning the sheet material so as to lie at the focal point of the laser beam.

3. A method as set forth in claim 2 wherein the step of accurately positioning the sheet material includes the steps of:
   supporting the sheet material on a support surface located such that the sheet material lies at the focal point of the laser beam; and
   evacuating the region between the sheet material and the surface to thereby draw the sheet material into contiguity with the support surface.

4. A method as set forth in claim 1 including the step of:
   accurately positioning the sheet material so as to lie at the focal point of the laser beam throughout the cutting operation by continuously controlling, respectively, the force of the cylindrical jet of inert gas acting against the first surface of the sheet material and the force of the atmosphere of inert gas acting against the second surface of the sheet material.

5. A method as set forth in claim 1 wherein the inert gas is nitrogen.

6. A method of cutting sheet material while preventing oxidation thereof comprising the steps of:
focusing a laser beam onto a first surface of the sheet material;
selectively moving the beam and the sheet material relative to one another to thereby cut the sheet material;
supporting the sheet material in a floating condition between first and second isolated atmospheres composed of inert gas applied respectively to the first surface and to a second surface opposite the first surface and thereby simultaneously isolating at least the region of the first and second surfaces surrounding the location at which the laser beam cuts through the sheet material; and
controlling, respectively, the force of the first atmosphere against the first surface and of the second atmosphere against the second surface to thereby maintain the sheet material at the focal point of the laser beam during the step of cutting the sheet material.

7. A method as set forth in claim 6 wherein the inert gas is nitrogen.

8. A method of cutting sheet material while minimizing oxidation thereof comprising the steps of:
advancing a continuous web of the sheet material through a work station at which the cutting operation is to be performed;
directing a beam from a first positionally fixed laser at an upper surface of the sheet material to thereby form a longitudinal cut in the sheet material; and
directing a beam from a second laser onto an upper surface of the sheet material;
moving the second laser beam laterally of the sheet material to thereby form a transverse cut in the sheet material;
isolating in an atmosphere of inert gas to lower surface of the sheet material proximate to the anticipated cut lines to be made by the laser beams; and
simultaneously directing a cylindrical jet of inert gas against the upper surface of the sheet material at which the laser beams are directed, the jet of inert gas being coaxial with each laser beam to thereby isolate a region of the first surface surrounding the location at which the beam strikes the first surface.

9. A method as set forth in claim 8 including the step of:
accurately positioning the sheet material so as to lie at the focal point of each of said first and second laser beams.

10. A method as set forth in claim 9 including the step of:
continuously controlling, respectively, the force of the cylindrical jet of inert gas acting against the upper surface of the sheet material and the force of the atmosphere of inert gas acting against the lower surface of the sheet material.

11. A method as set forth in claim 8 wherein the inert gas utilized is nitrogen.

12. A method as set forth in claim 9 wherein the step of accurately positioning the sheet material includes the steps of:
supporting the sheet material on a support surface located such that the sheet material lies at the focal point of each of the laser beams; and
evacuating the region between the sheet material and the surface to thereby draw the sheet material into contiguity with the support surface.

13. Apparatus for cutting sheet material comprising:
laser means adapted to direct a laser beam at an upper surface of the sheet material;
operating means for selectively moving said laser means and the sheet material relative to one another to thereby cut the sheet material by means of the beam;
a supporting surface adapted to receive the sheet material thereon;
channel means in said supporting surface defining a cavity adjacent a lower surface of the sheet material proximate to the anticipated cut line to be made by the laser beam;
a source of inert gas operatively connected to said channel means; and
said laser means including nozzle means for simultaneously directing a cylindrical jet of inert gas against the upper surface of the sheet material, said jet of inert gas being coaxial with the laser beam.

14. Apparatus as set forth in claim 13 including:
vacuum means in communication with said supporting surface for drawing the lower surface of the sheet material against said base surface as the sheet material moves thereacross.

15. Apparatus as set forth in claim 13 wherein the inert gas is nitrogen.

16. Apparatus as set forth in claim 13 wherein said operating means includes:
drive rollers frictionally engaging the sheet material and moving it past said laser means; and
wherein said laser means includes:
a stationary laser at a first station along the path of movement of the sheet material for cutting the sheet material in a longitudinal direction as it advances; and
a transversely movable laser at a second station along the path of movement of the sheet material spaced from said first station for cutting the sheet material in a transverse direction.

17. Apparatus as set forth in claim 16 including:
accumulator means engageable with the sheet material upstream of said second station and movable between a raised position permitting uninterrupted movement of the sheet material through said second station and a lowered position for momentarily lengthening the path of the sheet material for simultaneously momentarily interrupting advance of the sheet material at said second station;
thereby enabling said transversely movable laser to cut the sheet material in a direction perpendicular to the direction of the sheet material.

18. Apparatus as set forth in claim 13 wherein said laser means includes:
a laser movable transversely across the path of movement of the sheet material; and
drive means for moving said transversely movable laser to cut the sheet material along a line perpendicular to the path of movement of the sheet material.

19. Apparatus as set forth in claim 18 wherein said drive means includes:
a carriage supporting said transversely movable laser;

a longitudinal screw member operably engaged with said carriage for moving said carriage parallel to the path of movement of the sheet material;

a transverse screw member operably engaged with said carriage for moving said carriage perpendicular to the path of movement of the sheet material; and control means for operating said screw members in compound fashion to coordinate the respective speeds thereof to thereby cut the sheet material along a line perpendicular to the path of movement of the sheet material.

* * * * *